United States Patent [19]

Dixon, Jr. et al.

[11] Patent Number: 4,573,213
[45] Date of Patent: Feb. 25, 1986

[54] DUAL GUNN DIODE SELF-OSCILLATING MIXER

[75] Inventors: Samuel Dixon, Jr., Neptune; Harold Jacobs, West Long Branch, both of N.J.

[73] Assignee: The United States of America as represented by the Secretary of the Army, Washington, D.C.

[21] Appl. No.: 507,886

[22] Filed: Jun. 27, 1983

[51] Int. Cl.$^4$ ............................................. H04B 1/26
[52] U.S. Cl. .................................. 455/330; 455/323; 331/107 G; 333/110
[58] Field of Search ................ 455/321, 323, 325–328, 455/330–332; 331/107 DP, 107 G, 56; 333/110, 112, 113

[56] References Cited

U.S. PATENT DOCUMENTS

| | | | |
|---|---|---|---|
| 3,628,171 | 12/1971 | Kurokawa | 331/56 |
| 3,748,596 | 7/1973 | Reynolds | 331/107 G |
| 4,083,016 | 4/1978 | Zangrando et al. | 331/107 G |
| 4,147,994 | 4/1979 | Thoren et al. | 331/56 |
| 4,232,401 | 11/1980 | Chang et al. | 455/328 |
| 4,342,009 | 7/1982 | Dixon, Jr. | 331/107 G |
| 4,453,139 | 6/1984 | Labaar | 331/56 |

*Primary Examiner*—Jin F. Ng
*Attorney, Agent, or Firm*—Anthony T. Lane; Jeremiah G. Murray; Maurice W. Ryan

[57] ABSTRACT

A dual Gunn self-oscillating mixer is shown which can mix signals in the VHF range substantially without introducing any noise and with high input signal power handling capacity and with higher output mixed signal power than conventional, owing to boosted power from more than one microwave cavity. The device is comprised of two cavities and connected by a 180° phase shift coax line for injection locking, or a cavity wall hole in yet another embodiment. The device handles larger power levels without burning out as compared to conventional type mixer devices such as Schottky barrier diodes having nearly 30 times the burnout susceptibility.

10 Claims, 4 Drawing Figures

DUAL GUNN DIODE SELF-OSCILLATING MIXER

The invention described herein may be manufactured, used and licensed by or for the Government for Governmental purposes without the payment to us, or either of us, of any royalties thereon.

BACKGROUND AND FIELD OF THE INVENTION

The within described invention relates to the field of radar, millimeter wave devices, and to Gunn oscillators in particular.

In devising a mixing device for signals in the millimeter wave frequency range (30 to 300 GHZ) special problems may arise. A usual manner of providing a mixing function in such enviroments is to use hybrid couplers, having Schottky Barrier diodes, to create a balanced mixer. However, some of the disadvantages of such systems include excessive noise, high as 12.5 db DSB for example, and that the units can burn out at reaching a relatively low power level, 100 milliwatts CW, RF power for example. Yet there is a demand for ever higher power levels in modern communications equipment and a necessity for even greater fidelity in communication for which noise is detrimental. Improvement of devices for conventional mixing, especially in these two respects would therefore be greatly desirable.

BRIEF DESCRIPTION OF THE INVENTION

According to the invention, it is possible to slave two self-oscillating Gunn diode cavities and inject in a signal for the purpose of mixing with the self-oscillation signal within the cavity. A line connection is made between the cavities so that power may circulate therebetween and thereby have injection locking. The line is adjusted in length so that it is compatible with a 180° phase difference which exists between the two cavities. Two signals are fed along image lines into the two cavities at 180° phase difference that are derived from a signal intended for mixing by passing it through a 90° splitter, with one input dielectric line terminated in a load to avoid reflections. Another 90° phase shift, making 180° total, is accomplished in the lines by the coupling effect. When an energy signal of different frequency impinges upon a Gunn diode self-oscillating mixer a mixing operation results. This yields an intermediate frequency (IF) signal which is tapped from the cavity by an electrical lead. The IF signal represents the mixed signal which was sought, and it can be amplified and processed or displayed on the CRT.

OBJECTS OF THE INVENTION

Accordingly, it is an object of the invention to provide a high powered mixing device, suitable for use in high frequency communications systems.

Another object of this invention is to provide a mixing device which may handle relatively high powered energy signals, yet with low noise added and relatively higher burnout threshold.

A still further object of this invention is to provide a relatively low cost, high power, dielectric compatible mixing device suitable for application in modern communications systems.

These and other objects of the invention will be readily apparent to those skilled in the art in connection with the following description of the invention, and the appended drawings, in which:

LIST OF FIGURES

Figure 1:
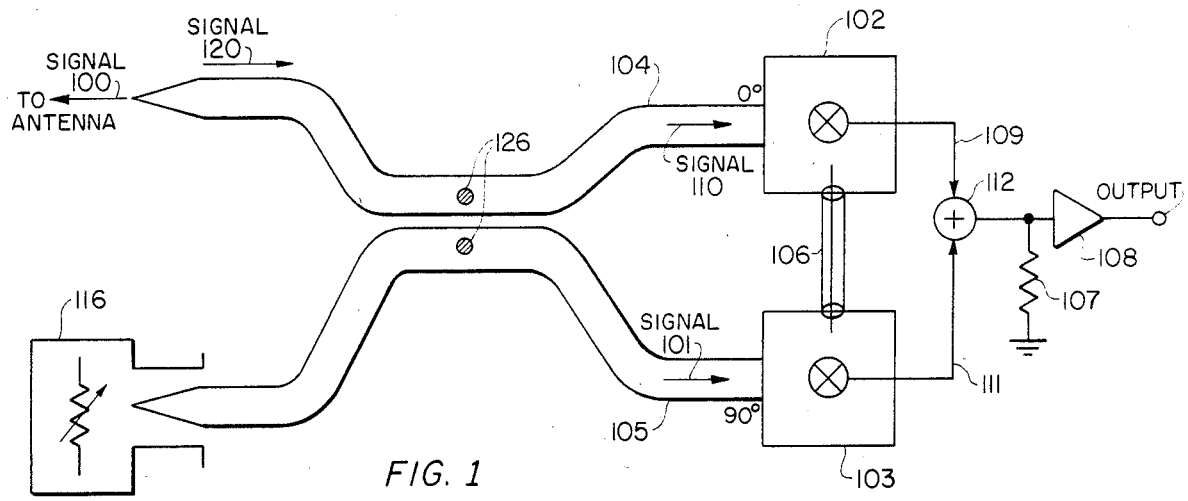
FIG. 1 is a top layout view of slaved Gunn diode cavity oscillators according to the invention.

In FIG. 1, two cavities 102, 103 are shown. The cavities, which may comprise internal structure such as in FIG. 2 as but one type of embodiment, are already self-oscillating at a select frequency. Both cavities are arranged to oscillate at the same frequency, and to insure this they are "injection locked", here by means of coax line 106. The purpose of line 106 is to allow energy waves from both cavities to intermix, thereby causing the two cavities to harmonize as one in effect, and oscillate at the same frequency. Other means of injection locking may instead by used; one other method is to move the cavities together so that they are back-to-back on adjacent sides, and to then delete coax 106 and replace its function by an aligned hole through both walls for the desired energy wave contact. It should be noted that a method is inherently shown here for boosting output power of cavity mixing devices by in effect having two or more cavities in "parallel", their mutual power being combined as at junction 112, e.g. In this mixing system it should be noted also that higher than conventional input power levels are being handled. The cavity-plus-Gunn diode as shown can handle approximately 30 times (3 watts averaged compared with 100 MW average) as much input power as a non-cavity Schottky Barrier diode element alone, a Tunett diode, or a two-beam lead diode for instance, which elements are conventionally used for mixing in these radar type applications. A cycle of use for this mixing system, used in a radar application, might be as follows: During a transmit cycle, a relatively high powered signal out of cavity 102 and/or, 103 may be allowed to propagate along image line halves 104, 105 respectively, joining in signal 120, delivered to for example an antenna connected to the left end of image line 104. At 126, the signals are coupled together thus doubling power usually transmitted by a single cavity alone. Signal 120 might represent for example a radar broadcast signal for which a return signal 100 is expected in a next subcycle. It is this signal 100 which will ultimately be mixed with the self-oscillating signals already subsisting within cavities 102 and 103. The frequency of signal 100 will mix with the common frequency in 102, 103 and will produce IF signals 109, 111 respectively in the cavities which IF signals are representative of the desired mixed quantities. The mixing of return signal 100 with that in the cavities is useful as an operation in radar correlation to determine a target, as is known. While details of the use of the IF signal in so determining a target will not here be explained, it is understood as an application to those skilled in the art.

Image lines 104, 105 together form a pair known as a 3 db hybrid image line coupler, or also as a dual inlet plastic dielectric waveguide coupler. Functionally, the coupler and overall image lines serve to impart a 180° phase shift total as will be explained and further to split a signal such as return signal 100 into signals 110 and 101, in region 126, where 90° phase shift is imparted, one half power to each cavity. In the reverse direction, split signals leaving the cavities can be coupled in region 126 into a joint signal. As a result of the hybrid coupler action, cavities 102, 103 are operating with input injected signals which are 180° apart, and this 180° phase difference accounts for complete noise cancellation, the noise signals being subtracted from one another, while the input signals are not. It is important that if line 106 is used, it should be made of a length consistent with the 180° phase difference of the two cavities, namely it should be an odd number of half wavelengths of the cavity frequency. Half of the full 180° phase shift, 90°, is first introduced in the region of the coupler 126 as was mentioned. In the region of 126 there are two painted magnetic dots found there, one on each image line facing one another, which accomplish these coupling and shifting functions. Because the power was split from a common signal 100, the two resulting signals 110, 101 have identical waveforms, and are equally of half amplitude each though shifted in phase 90°. An additional 90° phase shift, completing the 180° total needed, is imparted automatically in the lines 104, 105, as the signals 110, 101 pass to the cavities 102, 103, by the principle of induction in these lines which are sufficiently proximate to one another for field interaction. A load termination 116 here is needed to terminate the unused left end of line 105 so as to avoid line reflections in this unused branch. The image lines 104, 105, as will be explained further with reference to an alternative integrated version of the invention in FIGS. 3A and 3B, can be embodied of any high resistivity dielectric material such as quartz, alumina or even plastic. However, it is possible to also implement the lines of conventional waveguide hardware functional elements though more bulky, to have the coupling and phase shifting operations also done by conventional waveguide type functional elements though such plumbing is cumbersome, or of any other devices which will perform functions of conducting wave signals, splitting, coupling and phase shifting, as were described. Likewise, many type embodiments are possible for the self-oscillating cavities 102, 103 other than that sample shown in FIG. 2. Other substitutions of negative resistance devices than a Gunn diode are quite possible, and there are other ways possible to feed out the IF signals 109, 111 and combine them than those shown by FIG. 2 and the combination step shown by block 112. Use of grounded output resistor 107 and amplifier 108 as means of isolation and taking out the signal in a usable form can also be modified into any other arrangement for outputting which might be known in the art. Likewise, input dielectric 205 in FIG. 2 could be changed for a waveguide type input, possibly bolted onto the cavity or the like, with waveguide type image lines used for 104, 105. Any self-oscillating cavity could be used for 102, 103 provided it met the requirements explained above. The concept of combining more than one cavity for boosting output power handling capacity might also be expanded to three or more cavities, if the phase shifts could be properly arranged for noise cancellation, and other necessary functions described above were satisfied.

Figure 2:
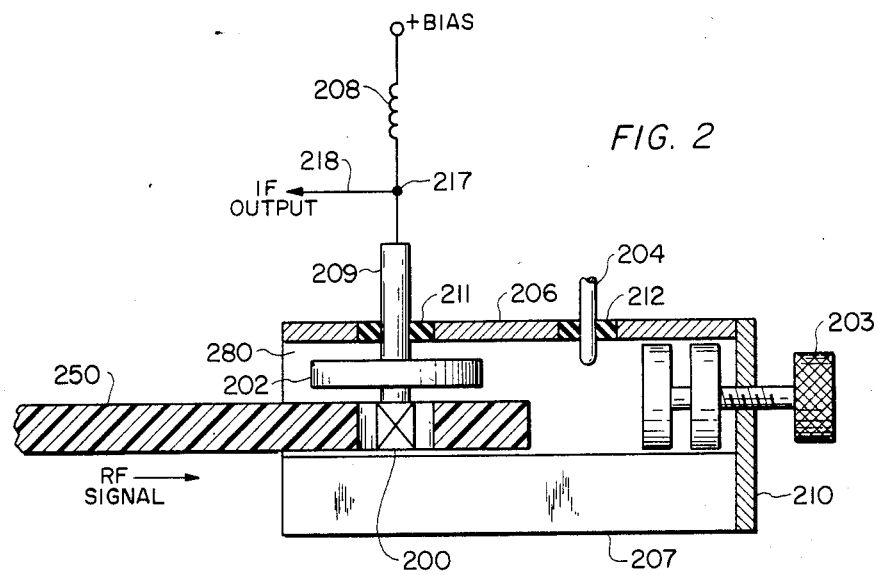
FIG. 2 is a cross-sectional side view of a Gunn diode cavity oscillator usable in this invention.

In FIG. 2, a cavity type oscillator capable of accepting a dielectric waveguide input 250 is shown in cross-sectional side view. This structure comprises a nonmagnetic metal cavity comprising metal top 206, metal base 207, metal end 210, metal back side 280, metal front side not shown; and left end being open to face the dielectric input shown.

Within the cavity bounded by the respective metal walls is found a suitably biased, self-oscillating Gunn diode 200; or other suitable negative resistance device generally. As explained, when energy waves impinge upon self-oscillating Gunn diode 200, they cause the Gunn diode self-oscillation to include a mixing operating of the new wave frequency with the self-oscillation frequency. An intermediate frequency (IF) oscillation signal in addition to the usual self-oscillating frequency signal and other frequency signals result from such mixing. The output intermediate frequency is of course related to the desired mixing signal. The self-oscillation of Gunn diode 200 is ordinarily accomplished with aid of biasing electrode 202, to which a biasing voltage of some +5 to +1 volts typically is applied by means of conductive rod 209 fed by a bias voltage applied through an inductive choke 208. The voltage applied by electrode 202 is ordinarily sufficient to cause the self-oscillations in Gunn diode 200 to begin; a typical frequency of operation might by 94 GHZ. Electrode size, shape and proximity among other factors of course also influences the said frequency; fine tuning may be accomplished by a metal tuner 203, which may be screw advanced deeper into the cavity or withdrawn as desired. The changed position of 203 within the confines of the cavity changes the cavity Q, or quality factor which directly affects the self-oscillating frequency. The electrode may be thought of as a coarse tuner, and 203 may be thought of as a fine tuner element.

Solid metal post 209 performs the function not only of conducting electricity down to elements 200 and 202, but also of physical anchoring support for the various elements, including elements 200 and 202. The post 209 and electrode 202 are typically round, top cross-sectionally, though they need not be so. Atop post 209 can be a Tee connection, at which place the bias line from inductor 208 may be connected such as at point 217, and from which an output line 218 could also be connected. Post 209 is electrically insulated from metal top wall 206 by low capacitance insulator 211, which is a non-conductive insert, such as a standard O.S.M. fitting. When waves impact between the self-oscillation frequency and the operational frequency of the injected waves, which presumptively are different in value, mixing can occur. If waves enter at a frequency of perhaps 95 GHZ, such signal waves will combine in the Gunn diode with the ongoing self-oscillating frequency which might be 94 GHZ for example. The different signals will mix, yielding an IF signal, among others, which will pass along post 209 eventually passing to 218 for output. This IF signal may also pass through a device for amplifying the signal if necessary so that it might be utilized. The amplifier may also posses band-pass filter properties so that only the IF signal might be amplified and passed through to output. Monitoring of cavity power levels may be done by having a metal RF probe 204 within a cavity to pick up presence of electrical power, the probe being electrically insulated from metal plate 206 by low capacitance insulator insert 212. Copper is a suitable material for the probe 204, as for the metal sides; however one could use any suitable non-magnetic conductive metal material. The coax line 106 shown in FIG. 1 is generally connected between the corresponding probes 204 of the two cavities though other methods might be used for power exchange for injection locking.

Figure 3A:
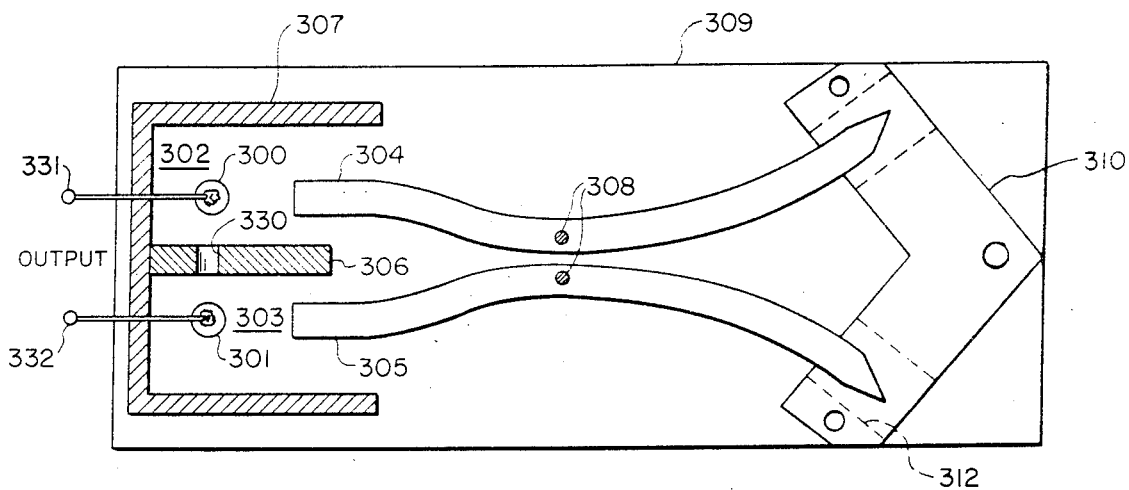
FIGS. 3A and 3B show respectively a plan top, and a side view for constructing an integrated V-band device according to this invention.
Figure 3B:
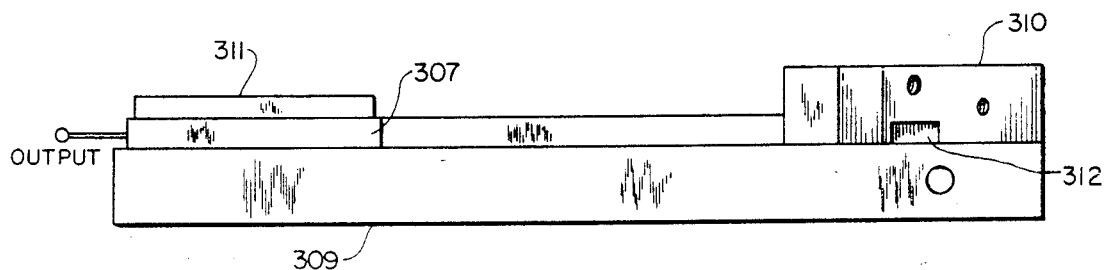

FIGS. 3A and 3B represent respectively the top and front side views of the entire network of this invention completely fabricated as a unitary structure on a single brass slab; the entire device can be commonly fabricated and made less than $2\frac{1}{2}''\times 1\frac{1}{2}\times \frac{3}{4}''$ in size.

Input slot 312 exposes the right most end of image guide half 305, corresponding to 104 of FIG. 1, at which place an antenna may be connected for two way transceiving as was mentioned earlier in regard to FIG. 1. It is also possible to merely inject here a signal to be mixed with the self-oscillating signal in the cavity(s). There need not be both a transmit signal and a later reflected signal in operation here, and no antenna is absolutely necessary; one could simply use the invention as an ordinary mixer without reference to a particualr radar enviroment with particular meaning attached to inputs and resulting IF mixed signal. An input at 312 could simply be mixed with a self-oscillation signal in cavity 302, or 303, or both. A ground plane 309, which could be of brass or other suitable metal, is here made $2\frac{1}{2}''\times 1\frac{1}{2}''\times \frac{3}{8}''$ thick though these and similar dimensions mentioned in this specification are generally for convenience and not critical. The hybrid 3db image lines which may be made of quartz are small as $1\frac{1}{4}''$ overall length, $1/20''\times 1/10''$ cross-section, and having a middle bend as shown extending for about $27/100''$ in the mid region of the coupler 308. The coupler comprises two adjacent dots of magnetic paint shown, though other means may be used for the coupling and phase shifting by 308. The two cavities 302 and 303 are here formed by inserting partition 306 mid way within "U" shaped housing 307. The dimensions of a cavity, though of sufficient size to accomodate the two dielectric image guides (dots) are, in other respects, relatively tiny, $9/20''\times 11/20''$ with the small Gun diode centered in a cavity barely $7/100''$ in from the housing's back wall. For the functions of biasing the Gunn diode and outputting the IF signal both, a wire (331,332) is merely soldered to the top of the Gunn diode in each cavity, and led out to coax plugs (not shown) respectively where coax connectors can be located. Though some of the functional parts of FIG. 2, i.e., electrodes, posts, probes, fine and coarse tuning, insulation, choke, inlet connections, may not be fabricated here in FIGS. 3A, 3B because of space limitations, a careful choice of layout, materials, sizes has been made here to ensure that the cavities will still similarly function, to self-oscillate, mix and the like, even without some of those refinements. A hole 330 in the wall 306 accomplishes the same injection locking, i.e., the maintenance of the same frequency of operation in both cavities, which function had been accomplished by coax 106 in FIG. 1. Atop housing 307 is a metal cover 311, which basically completes the cavities, they being open only on the side facing image lines 304, 305. As mentioned, cavities 302, 303, are injected with input signals from lines 304, 305, which signals are 180° apart in phase. As before, a natural 90° phase shift exists in the lines owing to induction, and 90° further is added by coupler 308. The "L" shaped element 310 serves to mount the lines, provide place for signals at 312, and also has a like input slot for connecting a load termination at unused end of line 304 to prevent reflections as was explained previously. The element 310 is only about $1\frac{1}{4}''$ on a side, and $\frac{3}{8}''$ in width and height, though such dimensions are but for convenience. The housing 307 and metal cover 311 are both only about $0.074''$ in height so one can appreciate the small sizes possible in this unitary fabrication. It can be readily seen that an integrated unit has now been described which is a complete mixing device in its own right. As mentioned earlier it is a mixing device capable of handling much higher input power levels than conventionally and further, deliver even higher boosted output power levels than heretofore possible based on those same input levels. The device further is relatively less expensive of construction, at least in the sense that the more expensive and often burning out Schottky barrier diodes have been replaced with the less expensive and more power burnout resistant Gunn diode devices. Further, there is almost complete noise cancellation owing to the 180° phase arrangement, making this a most desirable improved mixing device, particularly in radar correlator uses.

Shown therefore is a means for mixing two signals in the microwave range, yielding higher power, the power boosted by having more than one cavity, yet while introducing virtually no noise in the final mixed signal; and, of having a device with high power capacity for handling higher level inputs for the device owing to use of Gunn diode cavities of high power capacity instead of lone conventional elements which have a relatively low power level burnout capacity.

While this invention may have been described with respect to a particular embodiment or embodiments, the description also includes all substitutions and modifications within the spirit and scope of the invention, as will be understood by those skilled in this art.

What is claimed is:

1. A mixer device comprising in combination:
   two cavities, each including a self-oscillating negative resistance device, injection locked together by a connecting means, said connecting means being adjustable in length such that it is compatible with a 180° phase difference which exists between the locked together cavities;
   means to feed an input signal to the cavities;
   means for outputting signals from said negative resistance devices in the injection locked cavities and
   means for combining these signals to form a mixed signal.

2. The device of claim 1 wherein the input signal means comprises means to feed a first and a second signal of which said second signal is 180° out of phase with said first signal, for feeding to one of the cavities while said first signal is fed to the other.

3. The device of claim 2 wherein the negative resistance device comprises a Gunn diode.

4. The device of claim 3 wherein the said means to feed comprises a dual inlet plastic dielectric waveguide coupler.

5. The device of claim 4 wherein the said waveguide coupler additionally accomplished the function of a 90° phase shift while equally splitting the power of said input signal into the said second input signal and a third input signal.

6. The device of claim 5 wherein each of the cavities comprises a diode feed electrode having coarse tuning and means for outputting IF mixed signals, and further comprises fine tuning means for screw adjusting the quality factor and self-oscillating frequency of the cavity.

7. The device of claim 4 wherein one inlet of said waveguide coupler is terminated in a dummy load for avoiding line reflections.

8. The device of claim 2 wherein the connecting means comprises a coax line cut to a length of an odd number of half wavelengths, for the said 180° phase shift.

9. The device of claim 2 wherein the connecting means comprises an aligned connecting hole through the walls of adjacently placed cavities.

10. A dual cavity Gunn diode self-oscillating mixer device of unitary construction comprising;
 two microwave cavitites connected in a common wall, each cavity comprising;
 a Gunn diode, biased to be self-oscillating within the cavity;
 input means to each cavity to feed to the cavities the signals for mixing, the signals being 180° out of phase from one another, there being a hole in the common wall for power exchange, output means connected to the Gunn diode in each cavity for leading an output IF signal out of the cavity;
 means for combing the IF signals of the said cavities to produce an overall mixed signal.

* * * * *